United States Patent
Takeda

[19]

[11] Patent Number: 6,061,118
[45] Date of Patent: May 9, 2000

[54] REFLECTION SYSTEM FOR IMAGING ON A NONPLANAR SUBSTRATE

[75] Inventor: Nobuo Takeda, Sendai, Japan

[73] Assignee: Ball Semiconductor, Inc., Allen, Tex.

[21] Appl. No.: 09/350,815

[22] Filed: Jul. 9, 1999

Related U.S. Application Data

[60] Provisional application No. 60/092,295, Jul. 10, 1998.
[51] Int. Cl.[7] .............................. G03B 27/58; G03B 27/42
[52] U.S. Cl. ................................. 355/47; 355/53
[58] Field of Search ........................... 355/47–49, 53–55, 355/67–72; 359/14–15, 30; 430/5, 20, 30, 310, 311

[56] References Cited

U.S. PATENT DOCUMENTS

| | | | |
|---|---|---|---|
| 4,436,474 | 3/1984 | Brossman, Jr. et al. | 414/417 |
| 4,795,224 | 1/1989 | Goto | 350/6.3 |
| 5,113,064 | 5/1992 | Manhart | 250/201.9 |
| 5,461,455 | 10/1995 | Coteus et al. | 355/43 |
| 5,652,163 | 7/1997 | Schinella et al. | 437/51 |
| 5,686,230 | 11/1997 | Nellissen | 430/395 |
| 5,726,741 | 3/1998 | Kye et al. | 355/67 |
| 5,815,247 | 9/1998 | Poschenrieder et al. | 355/71 |
| 5,837,557 | 11/1998 | Fulford, Jr. et al. | 438/6 |
| 5,912,095 | 1/1999 | Katakura | 430/5 |
| 5,949,557 | 9/1999 | Powell | 359/8 |
| 5,955,776 | 9/1999 | Ishikawa | 257/618 |

FOREIGN PATENT DOCUMENTS 2221353  1/1990  United Kingdom.

*Primary Examiner*—Safet Metjahic
*Assistant Examiner*—Hung Henry Nguyen
*Attorney, Agent, or Firm*—Haynes & Boone, L.L.P.

[57] ABSTRACT

A system and a method for focusing an image onto the surface of a nonplanar substrate or device, such as a spherical semiconductor substrate, that substantially eliminates misalignment and overlapping problems between neighboring images. The system includes a plurality of mirrors arranged in a ring, a support reciprocatingly positioned relative to the center of the ring of mirrors for positioning the nonplanar substrate or device relative to the ring of mirrors. The nonplanar substrate or device is positioned such that each mirror will be capable of reflecting a focused image onto the surface of the substrate. The image is generated using a mask positioned relative to the ring of mirrors and illuminated to project the image onto the surface of the nonplanar substrate or device. The method includes the steps of positioning the nonplanar substrate or device within a ring of mirrors; creating a mask having a plurality of segments, wherein each segment has stitching interconnection, and projecting an image of the mask onto the ring of mirrors such that the image is reflected onto the surface of the nonplanar substrate or device.

17 Claims, 5 Drawing Sheets

REFLECTION SYSTEM FOR IMAGING ON A NONPLANAR SUBSTRATE

CROSS REFERENCE

This application claims the benefit of U.S. Ser. No. 60/092,295 filed Jul. 10, 1998.

BACKGROUND OF THE INVENTION

The invention relates generally to photo imaging on nonplanar substrates, and more particularly, to an imaging system for reflecting a two dimensional image onto a spherical semiconductor substrate.

Conventional integrated circuits, or "chips," are formed from two dimensional or flat surface semiconductor wafers. The semiconductor wafer is first manufactured in a semiconductor material manufacturing facility and is then provided to an integrated circuit fabrication facility. At the latter facility, several layers are processed onto the semiconductor wafer surface using various integrated circuit design and fabrication methods, such as very large scale integration ("VLSI") methods. Although the processed chip includes several layers fabricated thereon, the chip remains relatively flat.

A problem associated with modern integrated circuit fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility.

U.S. Pat. No. 5,955,776 entitled SPHERICAL SURFACE SEMICONDUCTOR INTEGRATED CIRCUIT, herein incorporated by reference as if produced in its entirety, describes a three dimensional, spherical-shaped substrate for receiving various circuits. Of the many process disclosed in the above-referenced application, several are related to imaging a circuit design onto the three dimensional substrate. Often, the circuit design to be imaged may be two dimensional in nature.

There are numerous problems associated with applying a two-dimensional circuit design to a three-dimensional object, such as a sphere. Specifically, very large scale integrated ("VLSI") circuit designs for flat chips are achieved by using two dimensional based computer aided circuit design tools. However, these conventional methods of VLSI circuit design are not suitable for three-dimensional surfaces because modifying a two dimensional design to fit onto a three-dimensional curved surface results in several problems. For one, a two-dimensional design element, such as a line or shape, is deformed when fitted over a three-dimensional curved surface. This deformation results in distortion of the circuit design, which results in undesirable integrated circuit performance. Another problem is that in two dimensional VLSI circuit design, square and/or rectangular design units are used to modularize the design for ready transformation onto a two-dimensional surface. However, these conventional units do not fit properly onto a curved surface, such as a sphere, especially at the outermost edges of the design units, resulting in an inefficient use of the spherical surface of the semiconductor.

Therefore, what is needed is a system and a method of projecting a two-dimensional image onto a three-dimensional object, such as a sphere, using a reflective system with a plurality of mirrors that substantially eliminates errors caused by misalignment of the connections between neighboring projected images.

SUMMARY OF THE INVENTION

The present invention, accordingly, provides a system and a method of projecting the image on a flat mask onto a three-dimensional object, such as a sphere, using a reflective system with a plurality of mirrors that eliminates misalignment problems at the interconnection between neighboring images. To this end, the system includes a plurality of mirrors arranged in a ring, a support that positions the sphere relative to the ring of mirrors so that each mirror in the ring reflects a focused image on a predetermined portion of the surface of the sphere, optical elements to focus the image, and a mask that is illuminated to project the image onto the mirrors. The method includes the steps of positioning the substrate within a ring of mirrors, creating a mask having a plurality of segments, wherein each segment has stitching interconnections, illuminating the mask to produce a projected image, focusing the projected image, and reflecting the image onto the surface of the substrate using the ring of mirrors.

An advantage of the present invention is that an image on a two-dimensional mask can be projected on to a three-dimensional surface to implement a circuit design within required manufacturing tolerances.

Another advantage of the present invention is that it uses stitching techniques for the interconnections between neighboring imaged mask segments that allows for manufacturing tolerances and, thus, eliminates misalignment problems.

BRIEF DESCRIPTION OF THE DRAWINGS

FIG. 6 also provides a flow diagram for projecting an image on the surface of the spherical substrate.

DESCRIPTION OF THE EMBODIMENTS

For the sake of clarity, two terms are defined for consistent use throughout the following description. A "sphere" is the set of all points P in space whose distance r is called the sphere of radius R and center O. A sphere is a surface and not a solid body, although it encloses a solid body, which is properly called an interior of the sphere; in particular, the center of a sphere is not a point of the sphere but is a point of the interior of the sphere. An "axis" of a circle of the sphere is a diameter of the sphere which is perpendicular to the plane of the circle.

Figure 1:
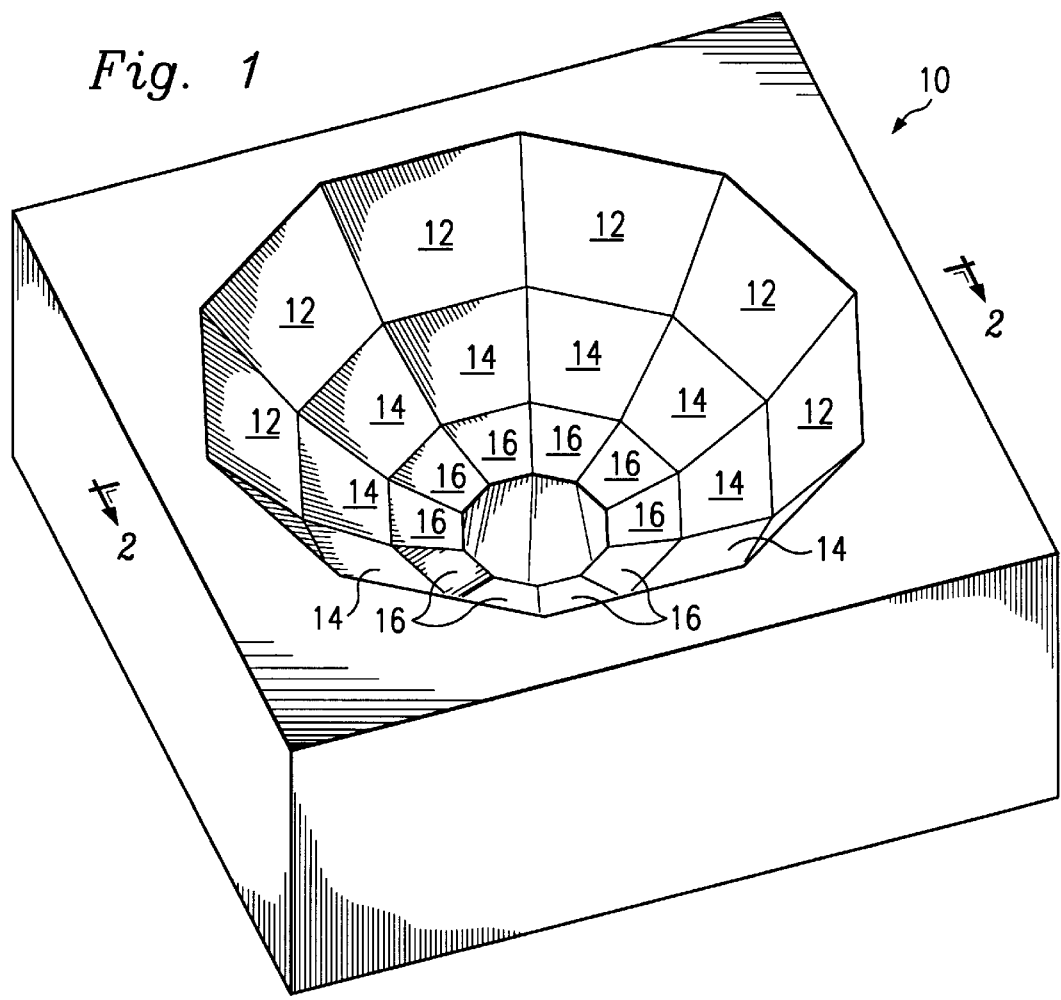
FIG. 1 illustrates a perspective view of a reflective bowl used in a system of the present invention for projecting a circuit design onto a spherical semiconductor substrate or device.
Figure 2:
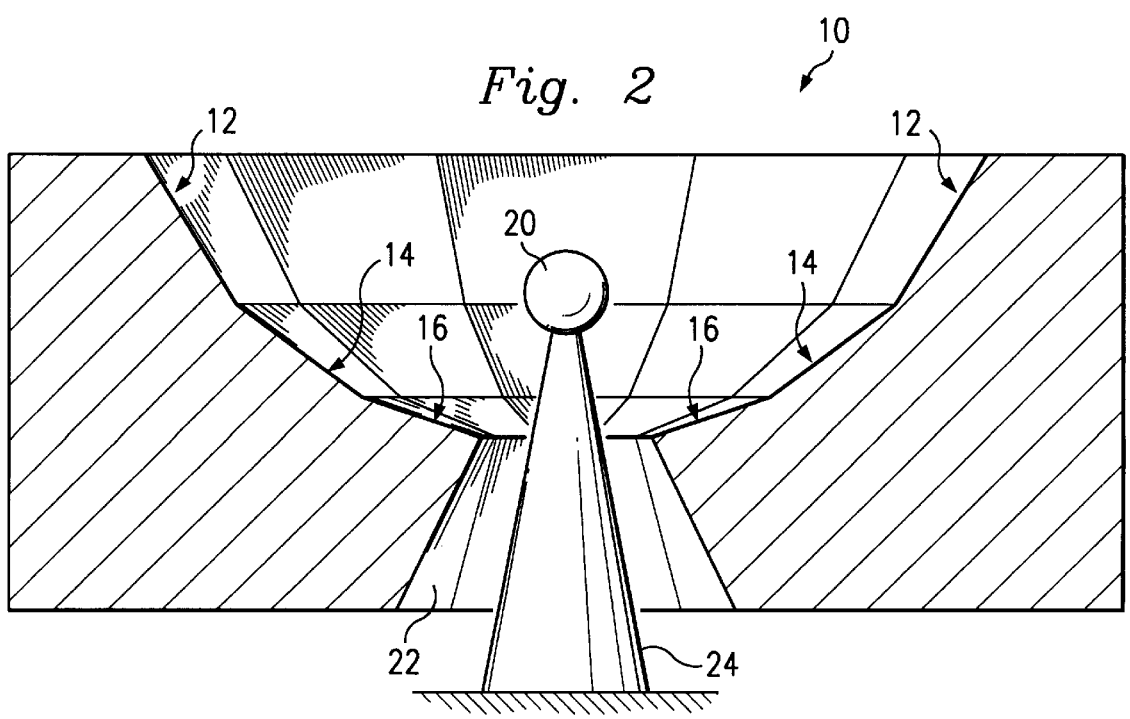
FIG. 2 illustrates a sectional view of the reflective system, taken along the line 2—2 of FIG. 1, with the spherical substrate positioned in the center of the system.

Referring to FIGS. 1 and 2, the reference numeral 10 refers, in general, to a complex-faceted reflective bowl used in an optical imaging system for projecting and focusing a two-dimensional mask using a plurality of mirrors arranged in a first row 12, a second row 14, and a third row 16 onto specific portions of a spherical substrate 20. It is understood that the spherical substrate 20 is used as an example, and that the invention could be used to project an image on a broad range of three-dimensional devices, including a spherical semiconductor substrate.

Figure 9:
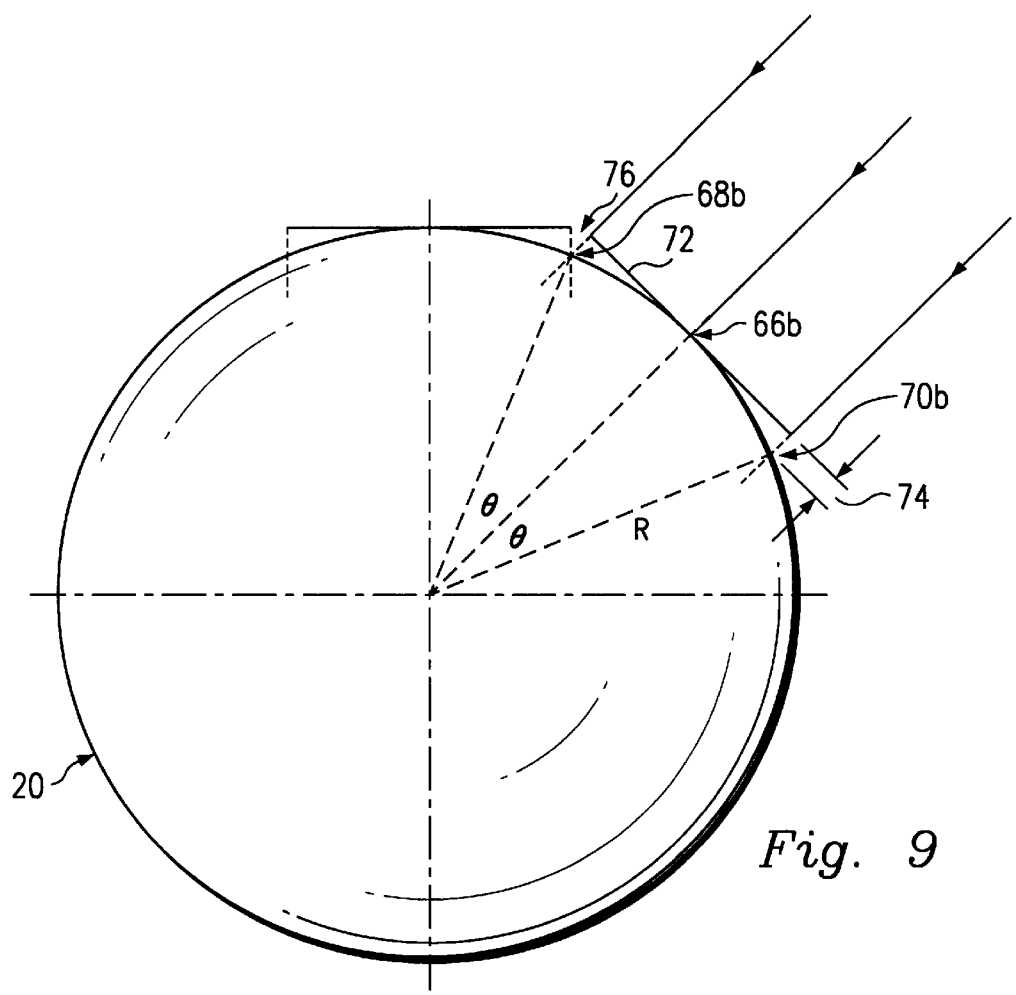
FIG. 9 illustrates image plane segments projected onto the surface of the spherical substrate.

The spherical substrate 20 is located at the focal center of the bowl 10 and has a radius R (FIG. 9). The spherical substrate 20 is positioned in the bowl 10 by raising it through an opening 22 in the bowl 10 using a support 24. The spherical substrate 20 is secured to the support 24 using a vacuum seal, although a variety of securing methods are contemplated. It is understood that the support 24 is used for example, and that the spherical substrate may be positioned for imaging by other means, such as a touchless nozzle described in U.S. patent Ser. No. 09/162,616, or as it free falls through the bowl 10. The support 24 locates the spherical substrate 20 to a predetermined position in the bowl 10 relative to the mirrors in the rows 12, 14, and 16 so that images reflecting off the mirrors in rows 12, 14, and 16 are focused on various portions of the spherical substrate 20.

Figure 3:
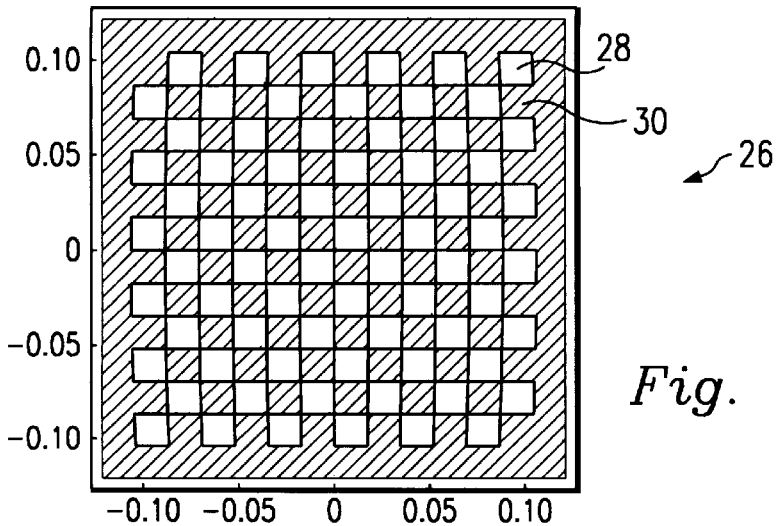
FIG. 3 illustrates a two-dimensional mask for a specified depth of focus, with substantially uniform segment shapes.
Figure 4:
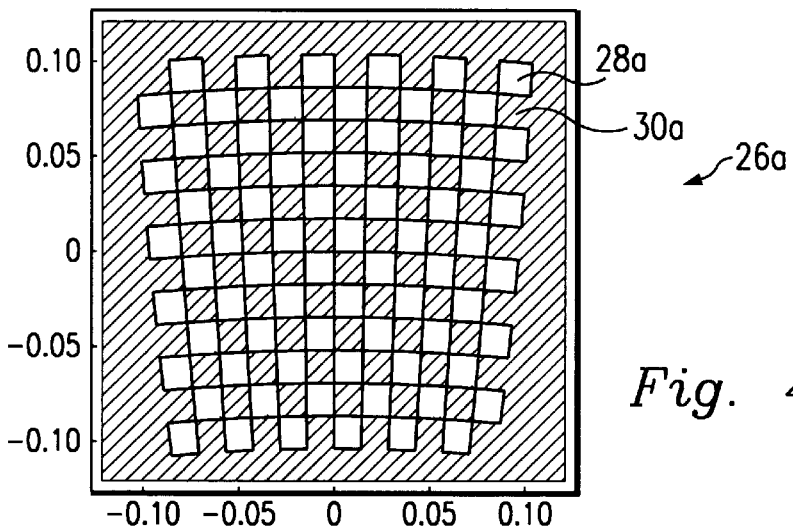
FIG. 4 illustrates a two-dimensional mask, similar to the mask of FIG. 3 wherein, the segment shapes vary in shape and area.
Figure 5:
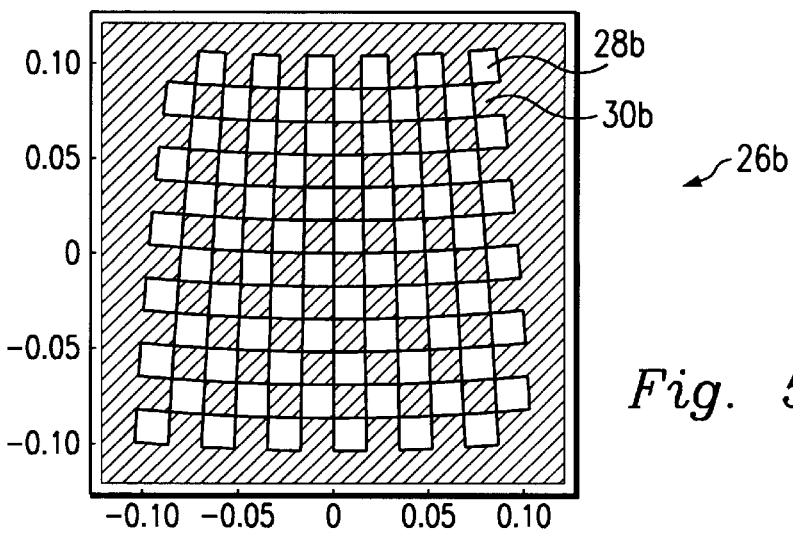
FIG. 5 illustrates a two-dimensional mask, similar to the mask of FIG. 3 wherein, the segment shapes vary in shape and area.

Referring now to FIGS. 3, 4 and 5, various mask designs are shown that can be illuminated and projected onto the mirrors of the bowl 10 and reflected onto the surface of the spherical substrate 20. For example, the mask 26 could be illuminated and reflected onto the surface of the spherical substrate 20 to create an image which will facilitate further processing of the spherical substrate 20. The mask 26 is divided into a plurality of subfields or segments, such as segments 28 and 30. The shapes of each segment can be altered to accommodate the distortions caused by projection of the mask 26 onto a three-dimensional surface, such as the spherical substrate 20. For example, a mask 26a has segments 28a and 30a to cover a predetermined area of the surface of the spherical substrate 20. Likewise, a mask 27b has segments 28b and 30b that are projected onto another predetermined area of the surface of the spherical substrate 20.

Figures 6, 7:
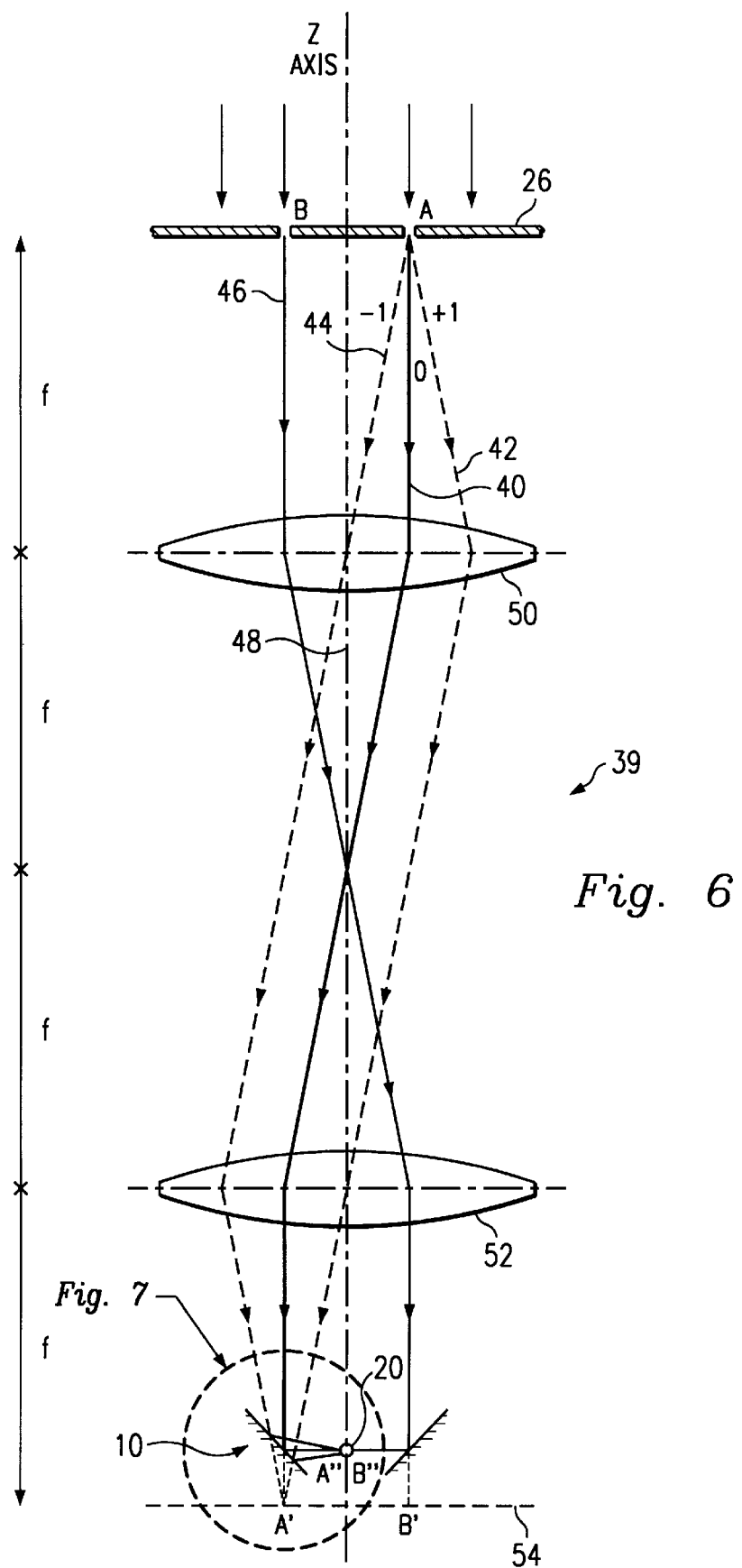
FIG. 6 illustrates a plurality of rays emerging from a mask and being focused and reflected onto a spherical semiconductor substrate using the system of FIG. 1.
FIG. 7 illustrates the reflection of zero order and first order rays onto the spherical substrate.
Figure 7:
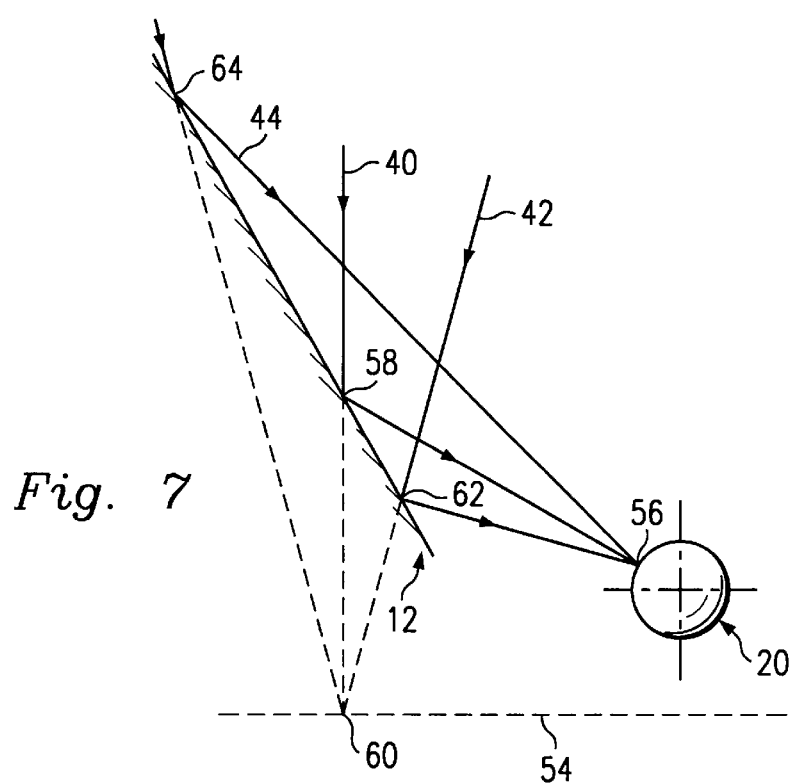

Referring now to FIGS. 6 and 7, as the mask 26 of a system 39 is illuminated, some of the segments of the mask allow passage of light while other segments block the passage of light. Accordingly, the mask 26 acts as a diffraction grating and the emerging rays are diffracted. For the sake of example, four emerging rays 40, 42, 44, and 46 are shown. Rays 40 and 46 are called zero-order nondiffracted rays while rays 42 and 44 are first-order diffracted rays. The zero-order nondiffracted rays are called paraxial rays and travel parallel to an optical "z" axis 48. The four rays 40, 42, 44 and 46 are shown emerging from the mask 26, with only the ray 46 emerging from the bottom portion of the mask 26, even though there are an infinite number of rays. Lenses 50 and 52 collimate and focus the rays, such as rays 40, 42, and 44, onto reflective surfaces, such as the mirrors or row 12, that reflect the rays onto the spherical substrate 20, as discussed in detail below. The positioning of the spherical substrate 20 within the bowl 10 is determined relative to an image plane 54 so that the mirrors, such as the mirrors of row 12, cause the diffracted first order reflections to converge at a point 56 on the surface of the spherical substrate 20. Likewise, higher order diffracted rays that are captured by the optics of the system 39 are collimated and focused on the mirrors of the bowl 10 and reflected onto the spherical substrate 20.

The spherical substrate 20 is positioned by the support 24 (FIG. 2) such that the distance from a reflection point 58 of the ray 40 to the point 56 is the same as the distance from the reflection point 58 to a converging point 60, on the image plane 54, traveled along the ray 40, as discussed in detail below. Likewise, the distance from reflecting points 62 and 64 to the point 56 is the same as the distance from the reflecting point 62 and 64 to the converging point 60, respectively.

Figure 8:
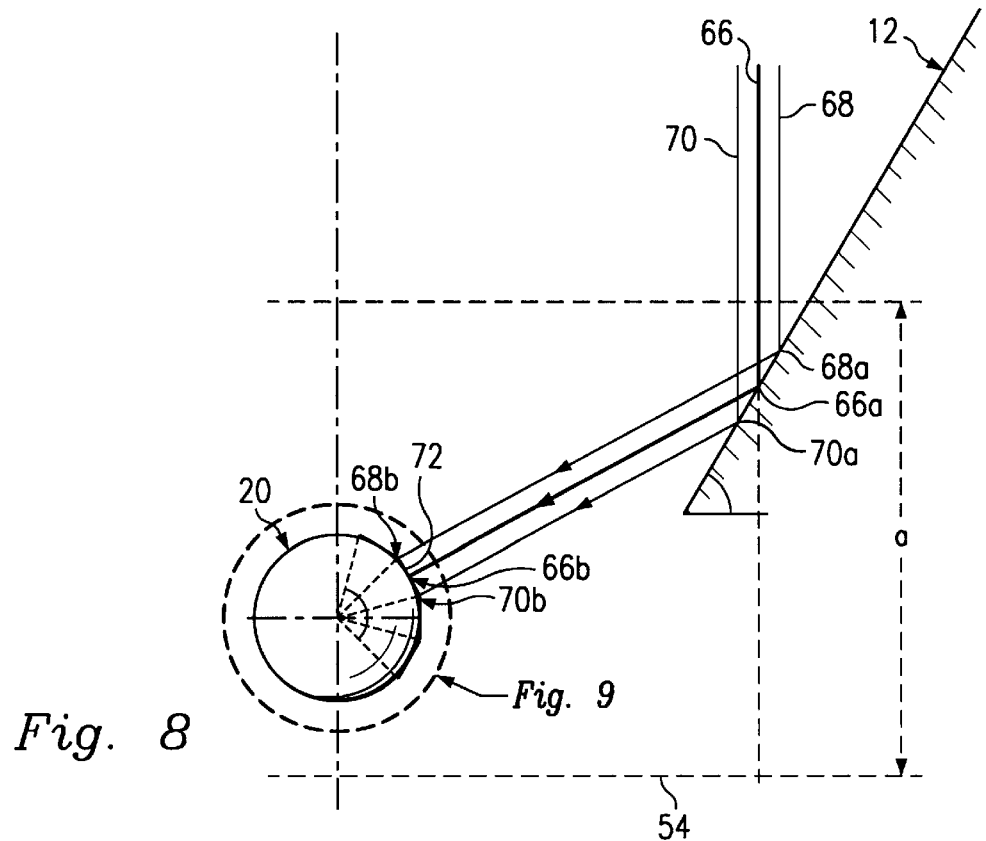
FIG. 8 illustrates a plurality of zero order rays being reflected onto the surface of the spherical substrate.

Referring now to FIGS. 8 and 9, zero-order nondiffracted rays 66, 68, and 70 represent rays passing though various segments of a mask, such as the mask 26 of FIG. 3. The rays 66, 68, and 70 represent rays emerging from a mask and being reflected by the mirror of row 12 onto the spherical substrate 20 at points 66b, 68b, and 70b, respectively. Likewise, other rays being reflected by the mirrors of rows 14 and 16, although not shown, are reflected onto the surface of the spherical substrate 20. The image plane 54 is located at a right angle to the direction of travel of the zero-order nondiffracted rays originating from the mask 26. The zero-order nondiffracted rays 66, 68, and 70 are reflected by the mirror of row 12 onto the surface of the spherical substrate 20, and therefore do not reach the image plane 54. The rays 66, 68, and 70 represent an image plane segment 72, which is reflected by the mirror in row 12 and is focused on the surface of the spherical substrate 20 instead of the image plane 54. As indicated above, the distance from any reflection point to the image plane segment is the same as the distance would have been from the reflection point to the image plane 54 if the ray had not been reflected by the mirror of row 12. However, a distance 74 exists from the point 68a and 70a to the surface of the spherical substrate 20 in addition to the distance from points 68a and 70a to the image plane 54. This distance 74 is caused by the fact that the surface of the spherical substrate 20, where the image plane segment 72 is focused, is not flat but a curved three-dimensional surface. If the distance 74 is large enough, the image projected will suffer loss of clarity and detail due to the limited depth of focus ("DOF") of the optics used in the system 39. The DOF of the optics determines the maximum distance that the outer edge of an image plane segment 72 can be from the spherical substrate 20 without losing the detail and visual definition required for acceptable image quality. The area of the image plane segment 72 is therefore limited by the DOF of the optical system. For example, as the area of image plane segment 72 increases, the surface area covered on the spherical substrate 20 increases and the distance 74 increases. However, the distance 74 can only be allowed to increase up to the DOF of the system 39.

When a flat mask, such as the mask 26 (FIG. 3), is used, flat image plane segments, such as the image plane segment 72, are generated. Thus, the image plane segment 72 curves as it is projected onto the surface of the spherical substrate 20 and the distance 74 at the outermost fringes is determined as follows:

$$\text{Distance } 74 = R(1 - \cos \theta) \tag{1}$$

where R is the radius of the spherical substrate 20 and θ is the angle between the radius R from a perpendicular radius to the plane segment 72. As discussed above, the DOF of the imaging optics must be larger than the distance 74 to ensure proper focusing and definition of the image. As neighboring image plane segments are projected onto the surface of the spherical substrate 20, they will overlap slightly to interconnect the segments through contact points.

Figure 10:
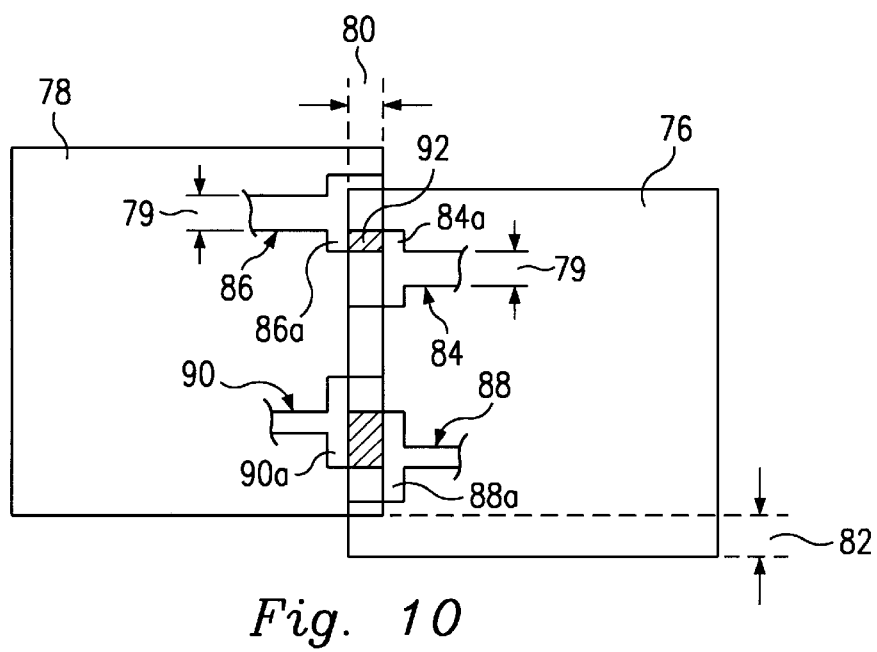
FIG. 10 illustrates a mask, and a method for making the mask, using stitching to correct alignment errors in the image plane segments.

Referring now to FIG. 10, two exemplary image plane segments 76, 78 represent adjacent plane segments from the mask 26 (FIG. 3). Both of the image plane segments 76, 78 have a plurality of lines with a minimum width 79. As shown in the figure, an outermost portion of the image plane segment 76 is misaligned with an outermost portion of the image plane segment 78 by a distance 80 in one direction and a distance 82 is another direction. If either of the misalignment distances 80 or 82 is unduly large, as compared to the minimum line width 79, connection between image plane segments 76 and 78 may not be possible. This is because the minimum line width 79 of the interconnections, such as interconnections 84, 86, 88 and 90, does not account for such distortion.

In order to overcome alignment problems, each interconnection that terminates at an outermost edge of the image plane segment utilizes a stitching interconnection. For example, stitching interconnections 84*a*, 86*a*, 88*a*, and 90*a* provide a larger contact area than the interconnections 84, 86, 88, and 90, respectively, to compensate for expected alignment errors. The expected distribution of alignment errors can be empirically determined and is related to the accuracy of the fabrication of the system components, and the accuracy with which the system components are aligned within the system. The stitching interconnections 84*a*, 86*a*, 88*a*, and 90*a* will be designed such that they are large enough to allow connection between image plane segments in the presence of these expected alignment errors. For example, when there is a misalignment between neighboring image plane segments 76 and 78, a connection will still be achieved between the connecter 84 and connector 86 because of an overlap 92 between stitching interconnections 84*a* and 86*a*.

It is understood that several modifications, changes and substitutions are intended in the foregoing disclosure and in some instances some features of the invention will be employed without a corresponding use of other features. For example, the number of rows of mirrors could be increased or decreased depending on the size of the segments or other design parameters. Accordingly, it is appropriate that the appended claims be construed broadly and in a manner consistent with the scope of the invention.

What is claimed is:

1. A system for projecting an image onto a surface of a nonplanar substrate, the system comprising:
    a plurality of mirrors arranged in a ring for reflecting an image on the surface of the substrate;
    a means for focusing the image on the surface of the substrate;
    a support reciprocatingly positioned relative to the center of the ring of mirrors for positioning the substrate relative to the ring of mirrors so that each mirror will reflect a focused image on the surface of the substrate; and
    a mask of the image positioned relative to the ring of mirrors so that the image is projected onto the surface of the substrate, wherein the image on the mask is separated into a plurality of discrete image segments and the mask is positioned so that each of the image segments corresponds to a specific mirror.

2. The system of claim 1 wherein the focusing means comprises:
    a plurality of lenses located between the mask and substrate for collimating and focusing the projected image.

3. The system of claim 1 wherein the nonplanar substrate is a spherical semiconductor substrate.

4. The system of claim 1 wherein each of the plurality of image segments comprises a plurality of interconnections having an overlap region.

5. The system of claim 1 wherein the area of each image segment is established in relation to the depth of focus of the system.

6. The system of claim 1 wherein the shape of each image segment is varied based on the location of the imaged segment on the substrate.

7. The system of claim 1 wherein the shape of each image segment when projected onto the nonplanar substrate is hexagonal.

8. A system for projecting an image onto a surface of a nonplanar substrate, the system comprising:
    a plurality of mirrors arranged in a ring for reflecting an image on the surface of the substrate;
    a means for focusing the image on the surface of the substrate;
    a support reciprocatingly positioned relative to the center of the ring of mirrors for positioning the substrate relative to the ring of mirrors so that each mirror will reflect a focused image on the surface of the substrate; and
    a mask of the image positioned relative to the ring of mirrors so that the image is projected onto the surface of the substrate;
    wherein the distance from a reflection point on the ring of mirrors to the surface of the substrate, measured along a central zero-order nondiffracted ray originating from the mask, is the same as the distance from the reflection point to a focal plane measured along a non-reflected path of the ray.

9. The system of claim 8 further comprising a second plurality of mirrors arranged in a second ring for reflecting a second image on the surface of the substrate, wherein the first ring of mirrors and the second ring of mirrors are concentric.

10. The system of claim 9 wherein the distance from a second reflection point on the second ring of mirrors to the surface of the substrate, measured along a second central zero-order nondiffracted ray originating from the mask, is the same as the distance from the second reflection point to the focal plane measured along a non-reflected path of the second ray.

11. A method for projecting an image on the surface of a nonplanar substrate, the method comprising the steps of:
    positioning the nonplanar substrate within a ring of mirrors;
    creating a mask having a plurality of segments for projecting an image onto the nonplanar substrate, wherein each segment has stitching interconnection; and
    projecting and focusing an image of the mask onto the ring of mirrors so that each of the segments aligns with each of the mirrors and the image is reflected in the mirrors and further onto the surface of the nonplanar substrate.

12. The method of claim 11 wherein the nonplanar substrate is a spherical semiconductor substrate and the projected image is utilized in processing the substrate to create integrated circuits.

13. A method for creating a mask with two segments to simultaneously project two relatively planar image plane segments onto a nonplanar substrate, the method comprising the steps of:

defining a first overlap region for the first image plane segment, the first overlap region including a first connector;

defining a second overlap region for the second image plane segment, the second overlap region having a second connector for connecting with the first connector; and expanding a size of the first and second connector in the first and second overlap regions, respectively, so that connections between the first and second image plane segments are unaffected by alignment errors caused by projecting the two relatively planar image plane segments onto the nonplanar substrate.

14. The method of claim 13 wherein the connections in the overlap region of the first and second plane segments are stitching connections.

15. A mirror subsystem for photo lithographic processing on a nonplanar substrate comprising a first plurality of discrete mirror components arranged in a first ring coaxial with the nonplanar substrate and a second plurality of discrete mirror components arranged in a second ring coaxial with the nonplanar substrate so that a first plurality of discrete mask components can be simultaneously reflected off the first plurality of mirror components and a second plurality of discrete mask components can be simultaneously reflected off the second plurality of mirror components, thereby projecting the first and second plurality of discrete mask components onto different portions of the substrate.

16. The subsystem of claim 15 further comprising a focusing system between the mask components and the mirror components so that the focusing system arranges light passing through the mask components onto the mirror components.

17. The subsystem of claim 15 wherein one of the discrete mirror components is not flat, thereby focusing the mask components onto one of the portions of the substrate.

\* \* \* \* \*